United States Patent [19]
Jayant et al.

[11] Patent Number: 5,892,775
[45] Date of Patent: *Apr. 6, 1999

[54] METHOD AND APPARATUS FOR PROVIDING ERROR-TOLERANT STORAGE OF INFORMATION

[75] Inventors: Nuggehally S. Jayant, Gillette; Jeffrey C. Lagarias, Summit, both of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 579,525

[22] Filed: Dec. 27, 1995

[51] Int. Cl.$^6$ .................................................... G06F 11/00
[52] U.S. Cl. .......................... 371/2.1; 380/28; 380/36
[58] Field of Search .................... 371/2.1, 38.1, 371/39.1, 43, 45; 380/28, 36

[56] References Cited

U.S. PATENT DOCUMENTS

| | | | |
|---|---|---|---|
| 4,100,374 | 7/1978 | Jayant et al. | 380/28 |
| 4,495,623 | 1/1985 | George et al. | 371/38 |
| 4,606,026 | 8/1986 | Baggen | 371/39 |
| 4,802,169 | 1/1989 | Suzuki et al. | 371/28 |
| 5,134,619 | 7/1992 | Henson et al. | 371/40.1 |
| 5,173,905 | 12/1992 | Parkinson et al. | 371/40.1 |
| 5,214,611 | 5/1993 | Shigehara et al. | 365/236 |
| 5,233,614 | 8/1993 | Singh | 371/21.6 |
| 5,262,342 | 11/1993 | Toyama et al. | 437/52 |
| 5,278,838 | 1/1994 | Ng et al. | 371/10.1 |
| 5,283,791 | 2/1994 | Halford | 371/40.4 |
| 5,285,451 | 2/1994 | Henson et al. | 371/11.1 |
| 5,313,464 | 5/1994 | Reiff | 371/2.1 |
| 5,483,541 | 1/1996 | Linsky | 371/2.1 |
| 5,490,264 | 2/1996 | Wells et al. | 395/481 |

FOREIGN PATENT DOCUMENTS

| | | |
|---|---|---|
| 0095028 | 11/1983 | European Pat. Off. . |
| 0635786 | 1/1995 | European Pat. Off. . |
| 0662659 | 7/1995 | European Pat. Off. . |

*Primary Examiner*—Phung M. Chung

[57] ABSTRACT

The device and method according to the present invention permute the order of signals representing information intended for storage in a memory. The signal ordering is permuted prior to or at the time of storage in the memory such that when the information or data is stored in the permuted order, it is more tolerant to errors or defects that existed or may occur in the memory.

15 Claims, 1 Drawing Sheet

METHOD AND APPARATUS FOR PROVIDING ERROR-TOLERANT STORAGE OF INFORMATION

BACKGROUND OF THE INVENTION

1. Technical Field

This invention relates to a method and a circuit for storing information such as digital data or signals in a permuted order in a memory storage device.

2. Discussion of Related Art

Recent advances in the manufacture of semiconductor devices have yielded memories having ever increasing speed and density characteristics. Generally, the higher the density of a semiconductor memory, the more memory sites or locations are available for data storage. However, the increased density renders the memory less error tolerant from defects or faults. For example, if a given area of the semiconductor memory is defective, whether from the manufacturing process or field-induced, more memory sites or a larger portion of the stored data will be corrupted. A field-induced defect may result from a magnetic storm which passes through certain areas of the memory, causing data corruption in that portion of the memory device and loss of data integrity required when data is read from the memory. Common memory defects are single dimensional, e.g., the memory is defective in a single row or column of a given matrix of the memory. Two dimensional faults involve multiple columns and/or rows.

SUMMARY OF THE INVENTION

The method and circuit according to the present invention provide error-tolerant storage of information in a storage medium. Generally, the information is arranged or assigned in a permuted order wherein consecutive elements of the information are stored in well-separated, or at least "nonadjacent", locations of the storage medium. The information may be in the form of digital data bits, samples of audiovisual signals or blocks of samples. If the information is time-ordered or is sequential, the method and circuit of the invention permute the time-ordering or the sequence associated with the elements of the information prior to or at the time of storage of the elements in memory. When the information is retrieved or read from the memory, the original time-ordering or sequence of the elements of the information is restored by de-permuting or inverting the writing or storage scheme.

A method according to the illustrative embodiment of the present invention provides error-tolerant storage of information in a storage medium having at least one area definable by M×N storage sites, the method comprising the steps of:

partitioning the information into a plurality of groups, at least one of the groups having a plurality of bits in consecutive time order and being suitable for storage in respective ones of said M×N sites;

arranging the plurality of bits in permuted order; and, storing the plurality of bits in the permuted order whereby consecutive bits occupy nonadjacent sites of said M×N sites of said storage medium.

The method further includes the steps of:

retrieving the stored plurality of bits from said storage medium; and, rearranging the retrieved plurality of bits in a de-permuting order to reconstruct at least one of the groups in consecutive time order.

Preferably, the step of reconstructing at least one of the groups from the memory includes reconstructing bits in the consecutive time order despite the existence of one-dimensional or two-dimensional errors in the memory.

The step of arranging the plurality of bits in a permuted order according to the illustrative embodiment of the present invention provides a Manhattan distance of at least 2 between any consecutive bits of at least one of the groups. Further, consecutive bits are arranged wherein they do not occupy the same row or column of the M×N sites. This ensures error-tolerant storage to at least one-dimensional errors. A Manhattan distance is a term known in the field as the sum of the horizontal distance and the vertical distance between two objects.

The illustrative method according to the invention also arranges the bit-ordering to provide a well-separated distance between consecutive bits, e.g., a Manhattan distance of 5 for 6×6 storage sites. The method further arranges the bit ordering such that consecutive bits do not occupy the same row or column. In such an embodiment, the memory is said to be error-tolerant to 2-dimensional errors.

Another illustrative embodiment of the present invention is a circuit for providing error-tolerant storage of digital signals, which comprises:

a storage medium having at least one area definable by M×N storage sites;

means for time-ordering the digital signals into S successive samples, S being equal to M×N;

means for accessing the storage medium including means for storing the S samples into the storage medium; and, a permutator for permuting the time-ordering of the S successive samples, the permutator being configured to cooperate with the means for accessing to store the S samples into the storage medium in a permuted order when neighboring bits of the S successive samples are stored in non-neighboring storage sites in the storage medium.

Preferably, the circuit according to the illustrative embodiment permutes the S successive samples in an order which well separates the distance between any neighboring samples, e.g., by a Manhattan distance of at least 2, and consecutive samples do not occupy the same row or column of the memory.

The circuit further includes a decoder for retrieving the S samples stored in the storage medium and for decoding the permuted order to recover the original time ordering of the S successive samples.

Advantageously, the illustrative technique according to the present invention of separation and storage of consecutive bits or samples facilitates error tolerance to at least single and two-dimensional faults in the storage device. Further, in the case in which the stored signal is a digital data sequence, and error-correcting coding is involved, the illustrative technique separates or "de-clusters" errors that require correction; thus, the technique makes simpler the error correction process. In the case in which the storage signal is an audio or video signal, the illustrative technique permits simpler signal enhancement at the receiving end by known techniques such as nearest neighbor interpolation.

DETAILED DESCRIPTION OF PREFERRED EMBODIMENTS

Figure 1:
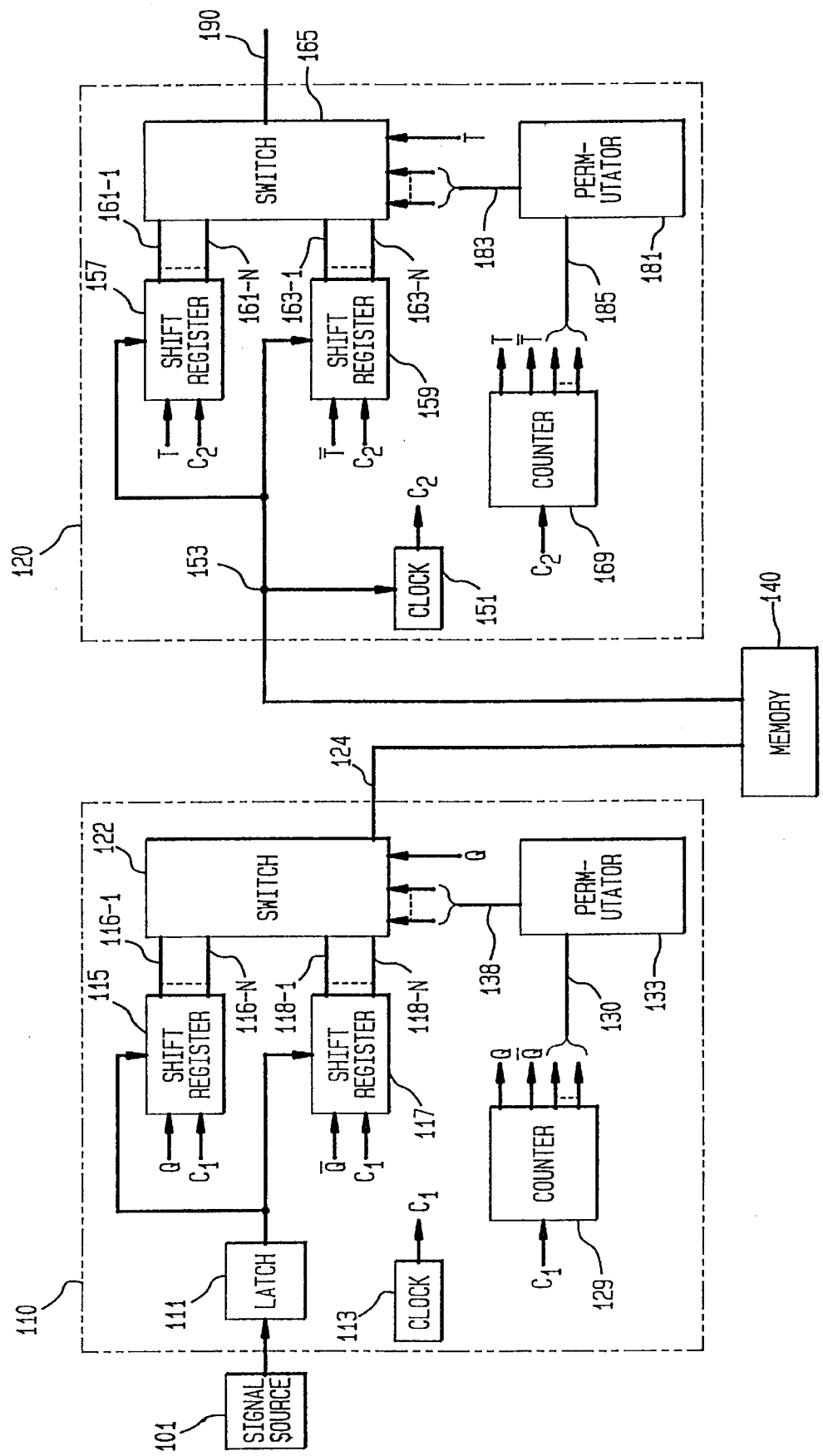
FIG. 1 illustrates a block diagram of a circuit for providing error-tolerant storage of information according to an illustrative embodiment of the present invention.

The device according to the illustrative embodiment of the present invention includes means for permuting the order of signals representing the information intended for storage in a memory. The signal time-ordering is permuted prior to or at the time of storage in the memory such that when the information or data is stored in the permuted order, it is more tolerant to errors or defects that exist, and/or that may occur in the memory.

FIG. 1 shows a circuit arrangement in which a signal or information from signal source 101 is processed by encoder 110 to provide error-tolerant storage of the information in memory 140.

Signal source 101 is an information source which is preferably digital data. The signal source 101 may also be in the form of analog signals such as human speech. The analog signals are digitized by a known sampling circuit (not shown) prior to being forwarded to encoder 110. Clock 113 supplies clock signal C1 to synchronize the signal source to encoder 110.

The output of data latch 111 is connected to the input of shift registers 115 and 117. Counter 129 is an n stage counter operative responsive to clock signal C1 from clock 113 to provide a coded output corresponding to the first n stages of the counter in complementary signals Q and Q' corresponding to the last counter stage. Thus, for the first n counts of the clock pulses, signal Q' is enabling and signal Q is inhibiting. Responsive to counter signal Q' and clock pulses C1, the output of data latch 111 is serially inserted into shift register 117. At this time, signal Q from counter 129 inhibits shift register 115 so that the previous n outputs from signal source 101 are temporarily stored therein.

For illustration, assume that shift register 115 is adapted to temporarily store 36 successive bits of signal source 101. Each of the stages of shift register 115 is connected to an input of switch 122, and switch 122 is operative responsive to each clock pulse to selectively transfer 1 of the 36 bits from register 115 to line 124. Switch 122 is addressed by the output of permutator 133, which is responsive to the output of stages 1 through 36 of counter 129.

According to the present illustrative embodiment, permutator 133 may be in the form of a look-up table or a customized sequencer. Permutator 133 responds to counter outputs 130 to generate control codes for appropriately switching the data output for storage in memory 140 at the appropriate time. In the case of a look-up table, the counter outputs an address for outputting the control codes stored in the look-up table to Switch 122. Similarly, a sequencer will output a preprogrammed control code depending upon the count from counter 129.

Memory 140 may be sectionalized into M×N storage sites. For example, in a 6×6 memory site area, the bit order may be arranged as shown in Table 1:

TABLE 1

| Row (i) | Column (j) | | | | | |
|---|---|---|---|---|---|---|
| | 0 | 1 | 2 | 3 | 4 | 5 |
| 0 | 1 | 3 | 5 | 20 | 22 | 24 |
| 1 | 7 | 9 | 11 | 26 | 28 | 30 |
| 2 | 13 | 15 | 17 | 32 | 34 | 36 |
| 3 | 19 | 21 | 23 | 2 | 4 | 6 |
| 4 | 25 | 27 | 29 | 8 | 10 | 12 |
| 5 | 31 | 33 | 35 | 14 | 16 | 18 |

Permutator 133 in cooperation with switch 122 outputs the 36 bits in accordance with the order shown in the matrix above by rearranging each number according to the formula $$6k_1+2k_2+k_3 \quad (1)$$

for numbers between 1 and 36, wherein $k_1$ is a modulo 6 number, $k_2$ is a modulo 2 number and $k_3$ is a modulo 1 number. The numbers 1 to 36 can be expressed as shown in Table 2:

TABLE 2

| K | $k_1$ | $k_2$ | $k_3$ |
|---|---|---|---|
| 1 | 0 | 0 | 0 |
| 2 | 0 | 0 | 1 |
| 3 | 0 | 1 | 0 |
| 4 | 0 | 1 | 1 |
| 5 | 0 | 2 | 0 |
| 6 | 0 | 2 | 1 |
| 7 | 1 | 0 | 0 |
| 8 | 1 | 0 | 1 |
| 9 | 1 | 1 | 0 |
| . | . | . | . |
| . | . | . | . |
| . | . | . | . |
| 35 | 5 | 2 | 0 |
| 36 | 5 | 2 | 1 | where $$(i,j)=k_1\,(1,0)+k_2\,(0,1)+k_3\,(3,3) \quad (2)$$

To illustrate the application of formula (2), take bit number 8 which, according to the modulo representation of Table 2, is 101. When applied to formula (2), the (i,j) position is $$1(1,0)+0(0,1)+1(3,3)=(1,0)+(3,3)=(4,3)$$

and bit number 8 can be found in the fourth row (i) and the third column (j).

As another example, bit number 26 is represented by 401 in Table 2 and $$(i,j)=4(1,0)+0(0,1)+1(3,3)=(4,0)+(3,3)=(7,3)$$

which is equivalent to (1,3) in modulo 6. It can be seen that bit number 26 is placed in the first row (i) and the third column (j).

Note that in the matrix where M and N=6 as shown in Table 1, consecutive bit numbers are well separated, the minimum separation between successive bit numbers having a Manhattan distance of 5, and consecutive bit numbers do not occupy the same row or column of the matrix. For example, bit numbers 2 and 3 are separated by 2 columns and 3 rows.

Advantageously, with the bit pattern as shown in Table 1 stored in memory 140, it is apparent to one of ordinary skill in the art that such storage arrangement is error tolerant to at least single or 2 dimensional faults or defects. For example, if data in a portion of the memory 140 is corrupted for any reason, such as in a magnetic storm or from a defective manufacturing process, the information recovered from decoding the uncorrupted stored data would still be intelligible.

To illustrate, suppose there exists data corruption in the area of the matrix denoted by (2,2) to (3,3) or error in bit numbers 17, 23, 32 and 2. Because the data corruption did not occur in consecutive or successive bit numbers, the information recovered from reading the memory and decoding the matrix is still largely intact and when reconstructed, would still be intelligible. This is especially true if the stored information is sampled audio signals.

In cases where the M×M matrix in which M is odd, the following formula is applicable:

$$M(i,j) = i(0,p-1) + j\frac{p+1}{2}, \frac{p-1}{2} \text{ for modulo } P \quad (3)$$

For example, a 5×5 matrix with M and N=5 wherein the bit numbers 1 to 25 are represented in lexicographic order is presented in Table 2.

|     | Column |    |    |    |    |
| --- | --- | --- | --- | --- | --- |
| Row | 0 | 1 | 2 | 3 | 4 |
| 0 | 1 | 24 | 17 | 15 | 8 |
| 1 | 21 | 19 | 12 | 10 | 3 |
| 2 | 16 | 14 | 7 | 5 | 23 |
| 3 | 11 | 9 | 2 | 25 | 18 |
| 4 | 6 | 4 | 22 | 20 | 13 |

It can be appreciated that the memory is more error-tolerant the further away the distance is between successive bit numbers. Preferably, the encoder 110 according to the present invention permutes the bit order so that the Manhattan distance between successive bits is at least 2 and successive bits do not occupy the same row or column. In most instances, with consecutive bits in different columns or rows, a Manhattan distance of 2 will be tolerant to one-dimensional errors, such as defects along rows, columns or diagonals in the memory of storage process. In the example shown above in Table 1, with the Manhattan distance of 5, the memory is tolerant to two-dimensional errors such as errors in the shape of rectangles, squares or circles.

To recover the signal source data stored in memory 140, the encoding process performed by encoder 110 is reversed by decoder 120 wherein counter 169, clock 151, shift registers 157 and 159 and access memory 140 are reversed in timing order from the writing process in encoder 110. The reversed ordering is performed by de-permutator 181 in cooperation with switch circuit 165 to rearrange the bit numbers in the sequential ordering as output by signal source 101. The information output at line 190 is then the recovered version of signal source 101.

If error correction coding is employed, usually for the case in which the signal source is a digital data sequence, an error correcting coder (not shown) is connected to output 190. Because of the "declustering" of the data sequence from the technique according to the illustrative embodiments of the present invention, the error correction codec overhead is reduced. Numerous error correction schemes known to one ordinary skilled in the art are applicable to the circuit and method of the present invention.

Although a number of specific embodiments of this invention have been shown and described herein, it is to be understood that these embodiments are merely illustrative of the many possible specific arrangements which can be devised in application of the principles of the invention. Numerous and varied other arrangements can be devised in accordance with these principles by those of ordinary skill in the art without departing from the spirit and scope of the invention.

What is claimed is:

1. A method for providing error-tolerant storage of information on a storage medium having at least one area definable by M×N storage sites, said method comprising the steps of:
    partitioning said information into groups, at least one of said groups having a plurality of bits in consecutive time order and being suitable for storage in respective ones of said M×N storage sites;
    arranging said plurality of bits in permuted order in response to at least one clock pulse of a first clock signal to provide a non-consecutive time order of said plurality of bits;
    transmitting said plurality of bits in non-consecutive time order to a communication medium in response to at least one control signal; and
    storing each of said plurality of bits in non-consecutive time order in respective ones of said M×N storage sites wherein consecutive time order bits occupy nonadjacent sites of said area of said storage medium.

2. The method according to claim 1, further including the steps of:
    retrieving said stored plurality of bits from said storage medium; and,
    reconstructing said at least one of said groups in said consecutive time order by rearranging said retrieved plurality of bits in a de-permuting order.

3. The method according to claim 2 wherein said step of reconstructing said at least one of said groups from said memory includes reconstructing bits in said successive time order despite the existence of one-dimensional errors in said memory.

4. The method according to claim 2 wherein said step of reconstructing said at least one of said groups from said memory includes reconstructing noncorrupted consecutive bits in said consecutive time order despite the existence of two-dimensional errors in said memory.

5. The method according to claim 1 wherein said step of storing said plurality of bits in a permuted order provides storage of consecutive bits of said at least one of said groups in different columns and rows of said M×N storage sites.

6. The method of claim 1 wherein M and N are the same dimension.

7. A circuit for providing error-tolerant storage of digital signals, comprising:
    a storage medium having at least one area definable by M×N storage sites;
    means for time ordering said digital signals into S consecutive bits, S being equal to M×N, said means for time ordering including at least one shift register configured to cooperate with at least one clock signal and at least one clock pulse for temporarily storing said S consecutive bits;
    means for accessing said storage medium including means for receiving at least one of said S consecutive bits from said at least one shift register in response to said at least one clock pulse, said means for accessing further including means for storing said S bits into said storage medium; and
    a permutator for permuting said time ordering of said S consecutive bits, said permutator is configured to cooperate with said means for accessing to store said S bits into said storage medium in a permuted order wherein neighboring bits of said S consecutive bits are stored in non-neighboring storage sites in said storage medium.

8. The circuit according to claim 7 wherein said permutator permutes said S consecutive bits in an order defined by a Manhattan distance of at least 2 between any neighboring bits.

9. The circuit according to claim 7, further including a decoder for retrieving said S bits stored in said storage medium and for decoding said permuted order for reconstructing said time ordering of said S successive bits.

10. The circuit according to claim 7, wherein said permutator permutes said S consecutive bits in an order which provides storage of neighboring bits in different rows and columns of said M×N storage sites.

11. The circuit according to claim 7 wherein M and N are of the same dimensions.

12. A method for providing error-tolerant storage of information on a storage medium having M×N storage sites, said method comprising the steps of:

partitioning said information into a plurality of signals, each suitable for storage in one of said M×N storage sites, said plurality of signals being in consecutive time order;

arranging said plurality of signals in permuted order in response to at least one clock pulse of a first clock signal to provide a non-consecutive time order of said plurality of signals;

transmitting said plurality of signals in non-consecutive time order to a communication medium in response to at least one control signal; and storing each of said plurality of signals in non-consecutive time order in respective ones of said M×N storage sites wherein consecutive time order signals are stored in different rows and columns of said M×N storage sites.

13. The method according to claim 12, wherein said step of storing further includes storage of consecutive signals in respective storage sites having a Manhattan distance of at least two.

14. The method according to claim 12, further including the steps of:

reading signals stored in said M×N storage sites; and, de-permuting said signals read from said memory into said consecutive time order.

15. The method according to claim 12, wherein M and N are the same dimension.

* * * * *